(12) United States Patent
Yu et al.

(10) Patent No.: US 10,594,132 B2
(45) Date of Patent: Mar. 17, 2020

(54) ELECTRICITY AMOUNT DETECTION METHOD AND DEVICE, TERMINAL AND STORAGE MEDIUM

(71) Applicant: Sanechips Technology Co., Ltd., Shenzhen, Guangdong (CN)

(72) Inventors: Xiang Yu, Shenzhen (CN); Xinfu Zhou, Shenzhen (CN)

(73) Assignee: SANECHIPS TECHNOLOGY CO., LTD., Shenzhen, Guangdong (CN)

( * ) Notice: Subject to any disclaimer, the term of this patent is extended or adjusted under 35 U.S.C. 154(b) by 298 days.

(21) Appl. No.: 15/505,646

(22) PCT Filed: Jan. 19, 2015

(86) PCT No.: PCT/CN2015/070993
§ 371 (c)(1),
(2) Date: Feb. 22, 2017

(87) PCT Pub. No.: WO2016/026268
PCT Pub. Date: Feb. 25, 2016

(65) Prior Publication Data
US 2017/0279266 A1    Sep. 28, 2017

(30) Foreign Application Priority Data
Aug. 22, 2014   (CN) .......................... 2014 1 0419097

(51) Int. Cl.
*G01R 21/00*   (2006.01)
*H02H 7/26*    (2006.01)
(Continued)

(52) U.S. Cl.
CPC ............. *H02H 7/262* (2013.01); *B60Q 11/00* (2013.01); *G06F 1/3206* (2013.01);
(Continued)

(58) Field of Classification Search
CPC . G01R 21/00; H02H 7/26; H02H 3/38; H02H 7/08; B60Q 11/00
See application file for complete search history.

(56) References Cited

U.S. PATENT DOCUMENTS 8,862,910 B2   10/2014   Sato
2009/0287433 A1   11/2009   Houston
(Continued)

FOREIGN PATENT DOCUMENTS

CN   102089731 A   6/2011
CN   102306118 A   1/2012
(Continued)

OTHER PUBLICATIONS

International Search Report in international application No. PCT/CN2015/070993, dated Apr. 29, 2015, 3 pgs.
(Continued)

*Primary Examiner* — Neel D Shah
(74) *Attorney, Agent, or Firm* — Cantor Colburn LLP

(57) ABSTRACT

Disclosed an electricity amount detection method and device, a terminal and a storage medium. The method includes that: Identity (ID) information of each function device called by an application is acquired according to ID information of the application; a power consumption parameter generated when each function device is called is correspondingly acquired according to the ID information of each function device called by the application; a power consumption parameter generated when the application is running is determined according to the power consumption parameter generated by each function device; and the power consumption parameter generated when the application is running is output as a power consumption index when the application is running.

20 Claims, 6 Drawing Sheets

(51) Int. Cl.

| | | |
|---|---|---|
| *G06F 1/3206* | (2019.01) | |
| *G06F 11/30* | (2006.01) | |
| *H04W 52/02* | (2009.01) | |
| *G06Q 10/00* | (2012.01) | |
| *G06F 1/3212* | (2019.01) | |
| *B60Q 11/00* | (2006.01) | |
| *G08B 13/196* | (2006.01) | |
| *H02H 3/38* | (2006.01) | |
| *H02H 7/08* | (2006.01) | |
| *G01R 22/06* | (2006.01) | |

(52) U.S. Cl.
CPC ........ *G06F 1/3212* (2013.01); *G06F 11/3062* (2013.01); *G06Q 10/00* (2013.01); *G08B 13/19634* (2013.01); *H02H 3/382* (2013.01); *H02H 7/0844* (2013.01); *H04W 52/0254* (2013.01); *G01R 22/06* (2013.01); *Y02D 10/34* (2018.01); *Y02D 70/00* (2018.01)

(56) References Cited

U.S. PATENT DOCUMENTS

| | | |
|---|---|---|
| 2010/0145643 A1 | 6/2010 | Katpelly |
| 2011/0040990 A1 | 2/2011 | Chan |
| 2011/0109613 A1 | 5/2011 | Asai |
| 2011/0313695 A1 | 12/2011 | Houston |
| 2012/0134517 A1 | 5/2012 | Sato |
| 2013/0018608 A1 | 1/2013 | Houston |
| 2014/0025322 A1 | 1/2014 | Yang |
| 2014/0088895 A1 | 3/2014 | Houston |
| 2014/0173319 A1 | 6/2014 | Zeng |

FOREIGN PATENT DOCUMENTS

| | | |
|---|---|---|
| CN | 102508761 A | 6/2012 |
| CN | 102591766 A | 7/2012 |
| CN | 102645571 A | 8/2012 |
| CN | 102918473 A | 2/2013 |
| CN | 103002157 A | 3/2013 |
| CN | 103543405 A | 1/2014 |
| CN | 103701970 A | 4/2014 |
| CN | 103914365 A | 7/2014 |
| EP | 2309363 A1 | 4/2011 |
| EP | 2741211 A1 | 6/2014 |
| EP | 2827161 A1 | 1/2015 |
| JP | 2006350481 A | 12/2006 |
| JP | 2010092210 A | 4/2010 |
| JP | 2012063917 A | 3/2012 |
| JP | 2013502181 A | 1/2013 |
| JP | 2013257680 A | 12/2013 |

OTHER PUBLICATIONS

English Translation of the Written Opinion of the International Search Authority in international application No. PCT/CN2015/070993, dated Apr. 29, 2015, 7 pgs.

Supplementary European Search Report in European application No. 15833490.4, dated Jul. 21, 2017, 8 pgs.

"An Analysis of Power Consumption in a Smartphone", Aaron Carroll and Gernot Heiser, May 2010, In Proceedings of the 2010 USENIX Conference on USENIX Annual Technical Conference, 14 pgs.

"An Energy Profiler for Android Applications Used in the Real World", Jan. 2013, Hiroki Furusho, Kenji Hisazumi, Takoshi Kamiyama, Hirosh Inamura, Tsunco Nakanishi and Akira Fukuda, IEICE Technical Report, Japan, The Institute of Electronics, Information and Communication Engineers, the 112nd vol., No. 373, 7 pgs. Entire Document in Japanese, English Abstract on p. 2.

ELECTRICITY AMOUNT DETECTION METHOD AND DEVICE, TERMINAL AND STORAGE MEDIUM

TECHNICAL FIELD

The disclosure relates to the electronic technology, and more particularly to an electricity amount detection method and device, a terminal and a storage medium.

BACKGROUND

Along with development of sciences and technologies, people's life depends on sciences and technologies more and more. Particularly, rapid development of mobile terminals meets usage requirements of people on electric appliances during movement, and portable devices become more and more popular. Along with improvement of speeds and performance of processors, applications installed on terminals are increasingly rich, so that besides the conventional wireless communication function, most of the terminals can implement functions such as audio, video, network, game, reading and the like. Some terminals are even equipped with peripherals such as various sensors and large screens to implement richer functions. While these newly added functions greatly enrich the applications and functions of the terminals, they bring a big problem that electric energy consumption is multiplied, thereby directly causing reduction in standby time and even affecting a main function of communication.

The electricity amount problem of the mobile terminal is usually solved by expanding capacity of a battery of the mobile terminal. However, development of batteries is far from keeping pace with addition of terminal functions. Moreover, problems about security, size, weight and the like also limit capacity expansion of batteries. Since supply cannot keep expanding, it may only turn to power consumption in order to deal with the problem. In terms of hardware, a device with lower power consumption may be used; and in terms of software, applications may be intelligently controlled and optimized without affecting user experiences, thereby reducing unnecessary power consumption. However, for optimizing and intelligently controlling applications, it needs to know about a power usage condition of each application running in the terminal and even a power usage condition of each function device, so that a purpose of reducing power consumption may be achieved by virtue of function optimization and overall intelligent control. Therefore, it is important to perform detection and analysis of, and thus exactly know about, power usage of each function device when an application is running, which may help application developers to develop applications with lower power consumption, and may provide more accurate and visual data and information for users. Moreover, a system may implement intelligent control over applications based thereon. Finally, longer usage time and richer information may bring good experiences to the users.

SUMMARY

In view of this, for solving the problem in the related art, embodiments of the disclosure provide an electricity amount detection method and device, a terminal and a storage medium, which may accurately determine a power usage condition of each function device when an application is running.

The technical solutions of the embodiments of the disclosure are implemented as follows.

On a first aspect, the embodiments of the disclosure provide an electricity amount detection method, which may include:

acquiring, according to ID information of an application, identity (ID) information of each function device called by the application;

correspondingly acquiring, according to the ID information of each function device called by the application, a power consumption parameter generated when each function device is called;

determining a power consumption parameter generated when the application is running according to the power consumption parameter generated by each function device; and outputting the power consumption parameter generated when the application is running as a power consumption index when the application is running.

On a second aspect, the embodiments of the disclosure provide a terminal, which may include a first acquisition unit, a second acquisition unit, a first determination unit and a first output unit.

The first acquisition unit is arranged to acquire Identity (ID) information of each function device called by an application according to ID information of the application.

The second acquisition unit is arranged to correspondingly acquire a power consumption parameter generated when each function device is called according to the ID information of each function device called by the application.

The first determination unit is arranged to determine a power consumption parameter generated when the application is running according to the power consumption parameter generated by each function device.

The first output unit is arranged to output the power consumption parameter generated when the application is running as a power consumption index when the application is running.

On a third aspect, the embodiments of the disclosure provide a battery detection device, which may include a power supply device, a Power Management Integrated Circuit (PMIC), N power supplies, N function devices, N electricity amount acquisition devices, a baseband processing chip and a memory, wherein N may be an integer more than 1, wherein:

a battery is shunted by the PMIC to form the N power supplies with completely different voltages;

the N function devices are connected with the N power supplies through N lines in an one-to-one correspondence according to respective required voltages;

on each line between the N function devices and the N power supplies, a respective one of the electricity amount acquisition devices is distributed; and each electricity amount acquisition device sends an acquired electricity amount to the baseband processing chip, which stores the electricity amount consumed by each function device in the memory.

On a fourth aspect, the embodiments of the disclosure provide a computer storage medium, in which a computer-executable instruction may be stored, the computer-executable instruction being arranged to execute the electricity amount detection method provided by the embodiments on the first aspect.

According to the electricity amount detection method and device, terminal and storage medium provided by the embodiments of the disclosure, the ID information of each function device called by the application is acquired according to the ID information of the application, the power consumption parameter generated when each function device is called is correspondingly acquired according to the ID information of each function device called by the application, the power consumption parameter generated when the application is running is determined according to the power consumption parameter generated by each function device, and the power consumption parameter generated when the application is running is output as the power consumption index when the application is running. Therefore, a power usage condition of each function device when the application is running may be accurately determined.

BRIEF DESCRIPTION OF THE DRAWINGS

FIG. 2-1 is a first implementation flowchart of an electricity amount detection method according to a second embodiment of the disclosure;

FIG. 2-2 is an implementation flowchart of Step 202 according to embodiment 2 of the disclosure;

DETAILED DESCRIPTION

The technical solutions of the disclosure will be further elaborated below with reference to the drawings and specific embodiments.

Embodiment 1

Firstly, the embodiment of the disclosure provides a power supply detection device. The power supply detection device is applied in a terminal. The terminal may be a terminal device such as an intelligent mobile phone, a tablet computer, a notebook computer, a desktop computer and a personal digital assistant. Power is usually supplied to each part in the terminal by virtue of one or more batteries. Of course, besides the battery for power supply, a direct current power supply may also be used for supplying power to the mobile terminal. Here, the battery or the direct current power supply may be called a power supply device of the terminal. No matter the terminal is powered with the battery or with the direct current power supply, a Power Management Integrated Circuit (PMIC) has to be provided to perform electric energy distribution and conversion, so as to form multiple paths of power supplies with different voltages. Here, the PMIC is also called a power management unit or a Power Manage Union (PMU). The PMU takes charge of electric energy conversion, distribution, detection and other electric energy management in the electronic terminal device. At present, there are many different chips and function devices in a terminal. For the chips, operation voltages of the chips include 5V, 3.3V, 2.5V, 1.8V and even lower. In addition, there are many terminals in which power supplies higher than a system power supply voltage are required. For example, a backlight power supply for driving liquid crystal display, ordinary white Light-Emitting Diode (LED) drive and the like in a battery power supply device may require boosting of the system power supply. The above-mentioned power supplies with the different voltages may be implemented by the PMU.

Figure 1:
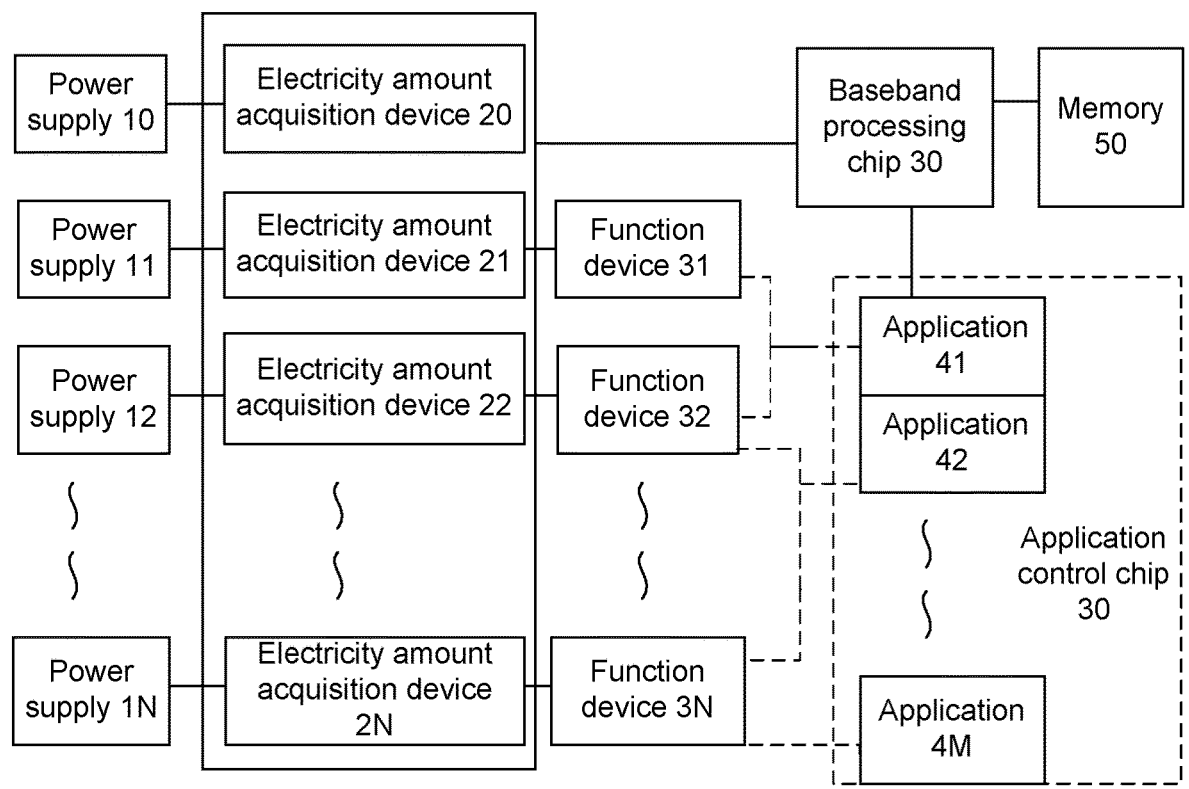
FIG. 1 is a block diagram of an electricity amount detection device according to a first embodiment of the disclosure.

FIG. 1 is a block diagram of an electricity amount detection device according to a first embodiment of the disclosure. As shown in FIG. 1, the electricity amount detection device includes a power supply device and a PMIC (not shown in FIG. 1), (N+1) power supplies, M function devices, N electricity amount acquisition devices, a baseband processing chip 30 and a memory 50, where N is an integer more than 1, and M is an integer less than or equal to N and more than or equal to 1.

The power supply device forms N power supplies 10 to 1N with different voltages through a shunt operation of the PMIC. The baseband processing chip 30 is connected with the power supply 10 through a line according to its own voltage requirement, the N function devices 31 to 3N are connected with the N power supplies 11 to 1N through N lines in a one-to-one correspondence according to their respective required voltages; and on each line between the N function devices 31 to 3N and the N power supplies 11 to 1N, there is a respective electricity amount acquisition device being distributed; the electricity amount acquisition device 20 is distributed on the line between the power supply 10 and the baseband processing chip 30; and the electricity amount acquisition devices 20 to 2N send acquired electricity amounts to the baseband processing chip 30, which stores the electricity amount consumed by each function device in the memory 50.

As can be seen from FIG. 1, the electricity amount acquisition devices are arranged between the power supplies and the function devices. The baseband processing chip may also be considered as a function device, while in FIG. 1, the baseband processing chip is independently shown as a special function device. The electricity amount acquisition devices acquire electricity amount which is supplied by the power supplies to the corresponding function devices; the electricity amount acquisition devices acquire the electricity amount consumed and/or charged by the power supplies; and the baseband processing chip is arranged to read and process electricity amount data acquired by the electricity amount acquisition devices, and store the processed electricity amount data in the memory.

In the embodiment of the disclosure, the power supply device of the terminal may be a switching power supply or a low-dropout linear regulator or other devices capable of supplying voltages and currents required by the function devices. The function devices are hardware components required by the terminal, such as a display device, an input device, a camera, a mainboard, a control device and other devices which cannot operate without power. The electricity amount acquisition devices may acquire power usage conditions of the power supplies, and are controlled by the baseband processing chip, and the data acquired by the electricity amount acquisition devices may be read by the baseband processing chip. The memory may be various non-volatile data storage devices, including an NAND flash, an NOR flash, a Trans-Flash (TF) card, a network memory and the like. The electricity amount acquisition devices 20 to 2N may be implemented as sensors.

In the embodiment of the disclosure, the electricity amount detection device may further include an application control chip 40, the application control chip 40 performs corresponding analysis according to the data processed by the baseband processing chip, and controls applications 41 to 4M. The application control chip may acquire unique identification information for each of the applications 41 to 4M, and may control running and stopping of the applications, where the unique identification information may be names or ID information of the applications, and one application may simultaneously use one or more function devices. For example, a running photographic application may call a display device, besides a camera, to display an obtained picture to a user. Therefore, when the photographic application is running, the display device and camera in the function devices may be called, thus consuming power of the terminal. From the above analysis, it can be seen that the electricity amount consumed when the photographic application is running may be calculated as a sum of electricity amounts consumed by the function devices called by the photographic application. Specifically, the electricity amount consumed when the photographic application is running is equal to a sum of the electricity amounts consumed by the individual function devices called by the photographic application, that is: the electricity amount consumed when the photographic application is running=electricity amount consumed when the camera is running+electricity amount consumed when the display device is running.

It is to be noted that the baseband processing chip and the application control chip may mutually acquire information and send information. The baseband processing chip and the application control chip may be a same processing chip, or may be two separate processing chips. In a specific implementation, the baseband processing chip may be a processing chip such as an application processor in the terminal.

In the embodiment of the disclosure, solid connecting lines and dotted connecting lines have different meanings. In FIG. 1, the solid connecting lines are intended to reflect mutual connection between hardware components, the dotted connecting lines are intended to reflect calling relationships. The software applications 41 to 4M are connected with the function devices by dotted lines, which means, when an application is running, an operating system needs to call the corresponding function device(s) to implement functions of the application.

Embodiment 2

Figures 1, 2:
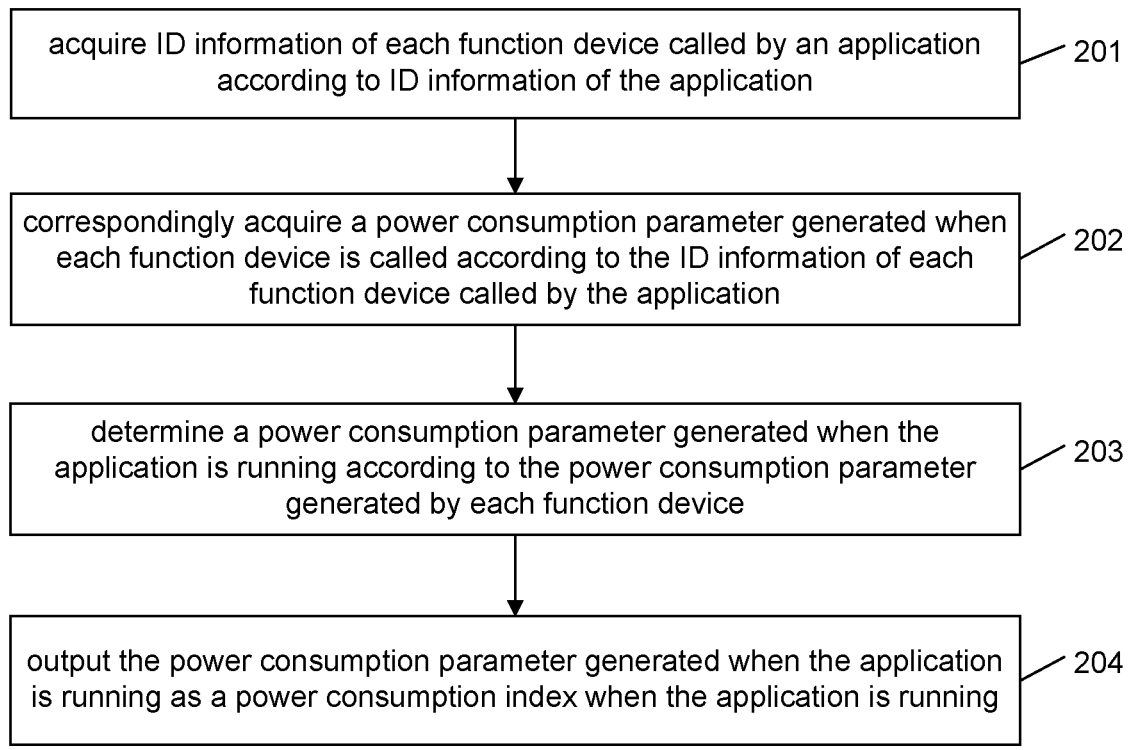
Figure 2:
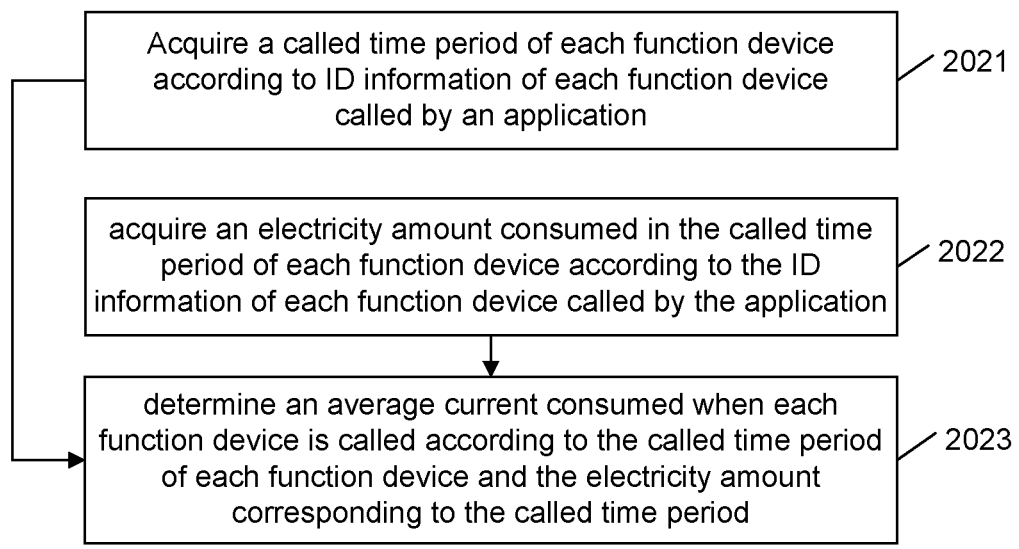

Based on the electricity amount detection device provided by the abovementioned embodiment, the present embodiment of the disclosure provides an electricity amount detection method. The method specifically describes how to the baseband processing chip and the application control chip in embodiment 1 analyse and process electricity amount data acquired by electricity amount acquisition devices and how to utilize the electricity amount data. FIG. 2-1 is a first implementation flowchart of the electricity amount detection method according to a second embodiment of the disclosure. As shown in FIG. 2-1, the method includes the following steps.

In Step 201, according to ID information of an application, ID information of each function device called by the application is acquired.

Here, the application includes any software application program installed in a terminal. It is to be noted that in the embodiment of the disclosure, the application may mainly refer to one, which when running, would start one or more function devices, thereby consuming electric energy. Based on such an understanding, an operating system installed in the terminal may also start the function devices to operate, thereby consuming the electric energy, and thus the operating system installed in the terminal may also be considered as an application as mentioned in Step 201.

Here, the function devices include devices which cannot operate without power, such as a display device, an input device, a mainboard and a control device.

In Step 202, according to the ID information of each function device called by the application, a power consumption parameter generated when each function device is called is correspondingly acquired.

Here, the power consumption parameter may include information such as a lowest current, a highest current, an average current and a voltage. The average current may be considered as the most important parameter in the power consumption parameters. In the embodiment of the disclosure, another parameter, i.e. electricity amount, closely related to the power consumption parameter may also be involved. Here, the electricity amount mainly refers to an electricity amount of a battery. The electricity amount of the battery may usually be described in ampere hour (Ah) or milliampere hour (mAh). For example, a 1,800 mAh battery means that the battery may be continuously discharged for 100 hours if an average current 18 mA is taken as a discharge current. In the embodiment of the disclosure, a unit of the electricity amount may be Ah, mAh or the like.

In Step 203, a power consumption parameter generated when the application is running is determined according to the power consumption parameter generated by each function device.

Here, the running application may inevitably consume the power of the terminal by calling the function devices, so that acquisition may be performed.

In Step 204, the power consumption parameter generated when the application is running is output as a power consumption index when the application is running.

In the embodiment of the disclosure, when the power consumption parameter is the average current, as shown in FIG. 2-2, Step 202 includes the following steps.

In Step 2021, a called time period of each function device is acquired according to the ID information of each function device called by the application.

Here, the running application may enable the corresponding function devices, and the ID information of each function device called by the application may be acquired from enabled interfaces.

Step 2021 will be described below with an example. For example, for applications shown in FIG. 1, it is supposed that the application 41 calls function devices 31 and 32 and the application 42 calls function devices 32 and 3N, wherein the application 41 calls the function device 31 in a time period t4131, and calls the function device 32 in a time period t4132, while the application 42 calls the function device 32 in a time period t4232, and calls the function device 3N in a time period t423N.

In Step 2022, an electricity amount consumed by each function device in the called time period is acquired according to the ID information of each function device called by the application.

Here, continuing with the example in Step 2021, it is supposed that when the application 41 is running, the called function device 31 has an electricity amount P4131 consumed in the time period t4131, and the called function device 32 has an electricity amount P4132 consumed in the time period t4132; and it is supposed that when the application 42 is running, the called function device 32 has a power consumption value P4232 in the time period t4232, and the called function device 3N has an electricity amount P413N consumed in the time period t413N.

In Step 2023, an average current consumed when each function device is called is determined according to the called time period of each function device and the electricity amount corresponding to the called time period.

Here, continuing with the example in Step 2022, since called time periods of the function devices and the electricity amounts consumed by the function devices in the corresponding time periods have been known in the above, the average current consumed when each function device is called is determined. Specifically, for example, for the application 41, an average current I4131 consumed by the function device 31 when the application 41 calls the function device 31=the consumed electricity amount P4131÷the time period t4131; and an average current I4132 consumed by the function device 32 when the application 41 calls the function device 32=the consumed electricity amount P4132÷the time period t4132.

For the application 42, an average current I4232 consumed by the function device 32 when the application 42 calls the function device 32=the consumed electricity amount P4232÷the time period t4232; and an average current I423N consumed by the function device 3N when the application 42 calls the function device 3N=the consumed electricity amount P423N÷the time period t423N.

In the embodiment of the disclosure, Step 2021 includes the following steps.

In Step B11, a starting time and corresponding ending time of calling each function device by the application are acquired according to the ID information of each function device called by the application.

In Step B12, the called time period of each function device is determined according to the starting time and corresponding ending time of calling each function device by the application.

Specifically, a difference between the starting time and corresponding ending time of calling each function device by the application is determined as the called time period of each function device.

Here, continuing with the example in Step 2021, as for the application 41, it is supposed that a starting time of calling the function device 31 by the application 41 is t4131-s and an ending time of calling the function device 31 by the application 41 is t4131-e, then a difference between t4131-s and t4131-e is the time period t3141 when the application 41 calls the function device 31.

In the embodiment of the disclosure, Step 2022 includes the following steps.

In Step B1, a first electricity amount consumed by each function device when the application starts calling each function device is acquired according to the ID information of each function device called by the application, and a second electricity amount consumed by each function device when calling of each function device is ended is correspondingly acquired.

In Step B2, for each function device, a difference between the second electricity amount and the first electricity amount is determined as the electricity amount consumed by each function device called by the application.

Here, continuing with the example in Steps B11 and B12, as for the application 41, it is supposed that first electricity amount consumed by the function device 31 when the application 41 starts calling the function device 31 is P4131-s and second electricity amount consumed by the function device 31 when the application 41 ends to call the function device 31 is P4131-e, then a difference between P4131-s and P4131-e is P4131 consumed by the function device 31 when the application 41 calls the function device 31.

It is to be noted that, in the embodiment of the disclosure, the called time period may also be implemented by a preset time period. For example, the preset time period is 15 seconds (s), and then it is only necessary to acquire the starting time when the application starts calling each function device and the first electricity amount consumed by the function device at the starting time, then after 15 s, acquire the second electricity amount consumed by the function device and determine the difference between the second electricity amount and the first electricity amount as the electricity amount consumed by each function device called by the application.

The embodiment of the disclosure provides a method for determining a power consumption parameter of an application when the application is running. Here, taking an average current as an example, the average current consumed when a certain application yy1 is running may be determined through the following steps.

In Step S21, a starting time (ta1, ta2 . . . ) of calling each function device (a1, a2 . . . ) is acquired, and electricity amount (Ca1, Ca2 . . . ) correspondingly consumed by each function device (a1, a2 . . . ) at the respective starting time is acquired.

Here, for example, when the application yy1 is running, the function device a1 is called by the application, a starting time of calling the function device a1 is ta1, and electricity amount consumed by the function device a1 at ta1 is Ca1. It is to be noted that the electricity amount Ca1 previously consumed by the function device a1 may not be consumed by the application yy1, so that in order to calculate the electricity amount consumed by yy1, it is necessary to subtract the electricity amount consumed by the another application.

In Step S22, after a preset time period, an ending time (tb1, tb2 . . . ) when calling of each function device (a1, a2 . . . ) is ended within a preset time is acquired, and electricity amount (Cb1, Cb2 . . . ) correspondingly consumed by each function device (a1, a2 . . . ) at the respective ending time is acquired.

In Step S23, electricity amount (C1, C2 . . . ) respectively used by each function device (a1, a2 . . . ) within the preset time period is calculated, and an average current (Ia1, a2 . . . ) corresponding to each function device is determined according to the electricity amount (C1, C2 . . . ).

Taking the function device a1 for example, descriptions will be made about calculation of the average current Ia1 consumed by the function device a1 when the application yy1 calls the function device a1. A calculation formula (12) is as follows:

$$C1=Cb1-Ca1 \quad (11),\text{ and}$$

$$Ia1=C1\div(tb1-ta1)=(Cb1-Ca1)\div(tb1-ta1) \quad (12)$$

Similarly, taking the function device a2 for example, the average current Ia2 consumed by the function device a2 when the application yy1 calls the function device a2 is Ia2=(Cb2−Ca2)÷(tb2−ta2). Similarly, the average currents (Ia3, Ia4 . . . ) consumed by the function devices (a3, a4 . . . ) when the application yy1 calls the function devices (a3, a4 . . . ) may be calculated.

In Step S24, a sum of the average currents consumed by all the function devices called by the application is determined as an average current Iyy1 consumed when the application is running.

Here, determination of the average current Iyy1 consumed when the application is running may refer to formula $$Iyy1=Ia1+Ia2+Ia3+Ia4+\ldots \quad (13).$$

Embodiment 3

Based on the abovementioned embodiment, before Step 202, the method further includes that: a list at least including the ID information of the application and the electricity amount consumption parameter corresponding to the application is formed, wherein the power consumption parameter at least includes the average current.

Correspondingly, Step 202 includes that: the list is queried to obtain the power consumption parameter generated when each function device is called according to the ID information of each function device called by the application.

Here, when the power consumption parameter is the average current, the step of forming the list at least including the ID information of the application and the power consumption parameter corresponding to the application includes the following steps.

In Step A11, each time when the terminal is started, ID information of applications which are running is acquired.

Here, it is supposed that an application 41 and an application 42 are running in the terminal after the terminal is started, then ID information of the application 41 and the application 42 is acquired, and labels 41 and 42 may be determined as the ID information of the applications.

In Step A12, according to the ID information of the applications which are running, ID information of each function device called by the applications which are running is correspondingly acquired.

Here, continuing with the example in Step A11, it is supposed that the application 41 calls function devices 31 and 32 and the application 42 calls function devices 32 and 3N, 31, 32 and 3N may be determined as ID information of the function devices, respectively.

In Step A13, for each application which is running, a power consumption parameter of each function device called by each application which is running is acquired, and a list is formed according to the power consumption parameter when each function device is called, the ID information of the corresponding application and the ID information of the function device.

Here, continuing with the example in Step A12, firstly, as for the application 41, a power consumption parameter when the application 41 calls the function device 31 is H4131, and a power consumption parameter when the application 41 calls the function device 32 is H4132. Then as for the application 42, a power consumption parameter when the application 42 calls the function device 32 is H4232, and a power consumption parameter when the application 42 calls the function device 3N is H423N. Then, a finally formed list may refer to Table 1.

TABLE 1

| ID information of application | Total power consumption parameter | ID information of called function device | Power consumption parameter |
|---|---|---|---|
| Application 41 | H41 (such as I41) | Function device 31 | H4131 (such as I4131) |
| | | Function device 32 | H4132 (such as I4132) |
| Application 42 | H42 (such as I42) | Function device 32 | H4232 (such as I4232) |
| | | Function device 3N | H423N (such as I423N) |

Generally speaking, the power consumption parameter mainly refers to a current, and may be the average current. Therefore, for a specific application, besides an average current consumed by each function device, there is an average current associated with the application, and moreover, the average current associated with the application is equal to a sum of the average current consumed by each function device. For example, for the application 41 in Table 1, it is supposed that an average current associated with the application 41 is I41 and currents consumed when the application 41 calls the function devices 31 and 32 are I4131 and I4132 respectively, then I41=I4131+I4132.

For the above list, the step of forming the list according to the power consumption parameter generated when each function device is called, the ID information of the corresponding application and the ID information of the function device includes that:

it is judged whether ID information of an application which is running is included in the list or not, if YES, the power consumption parameter of the application in the list is updated, and if NO, the ID information of a new application, ID information of function devices called by the newly added application and a power consumption parameter corresponding to each function device are added into the list.

Figure 3:
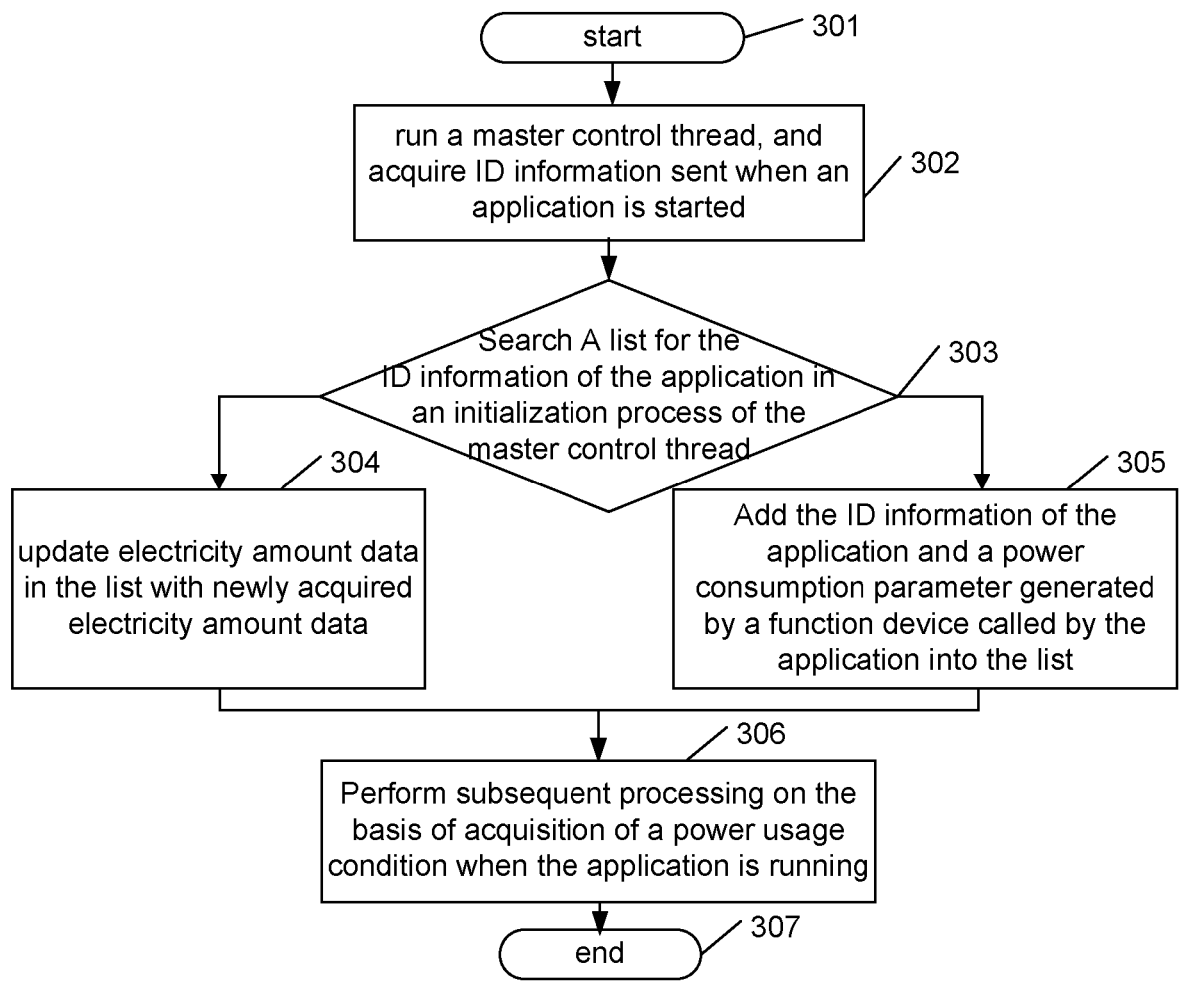
FIG. 3 is an implementation flowchart of a process of forming a list according to a third embodiment of the disclosure.

A method for forming a list is provided below. FIG. 3 is an implementation flowchart of a process of forming a list according to a third embodiment of the disclosure. As shown in FIG. 3, a process includes the following steps.

In Step 301, the process is started.

In Step 302, a master control thread is running, and ID information sent when an application is started is acquired.

In Step 303, in an initialization process of the master control thread, a list is searched for the ID information of the application.

In Step 304, if the ID information of the application is found, electricity amount data in the list is updated with newly acquired electricity amount data.

Specifically, more than three groups of electricity amount data may be stored, and an average value of the three groups of data is determined as final reference data to ensure higher data accuracy.

In Step 305, if the ID information of the application is not found, the ID information of the application and a power consumption parameter generated by a function device called by the application are added into the list.

Here, the newly added application may be synchronously stored in a storage unit when the list is refreshed.

In Step 306, subsequent processing is performed on the basis of acquisition of a power usage condition when the application is running.

In Step 307, the process is ended.

Figure 4:
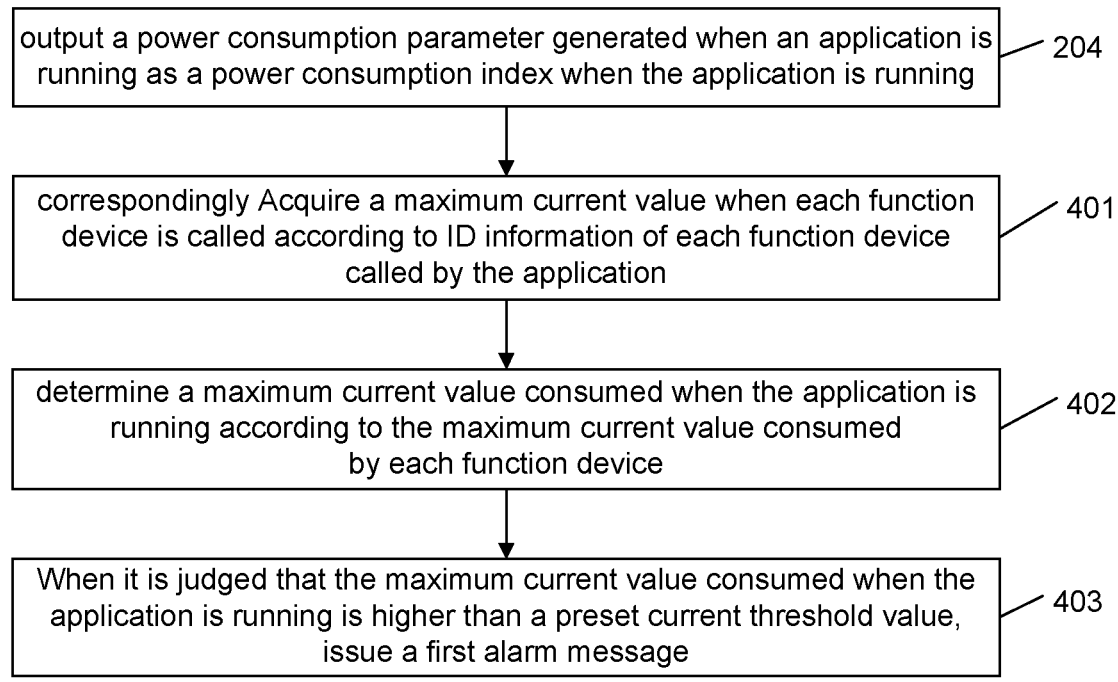
FIG. 4 is a first implementation flowchart of an electricity amount detection method according to embodiment 4 of the disclosure.
Figure 5:
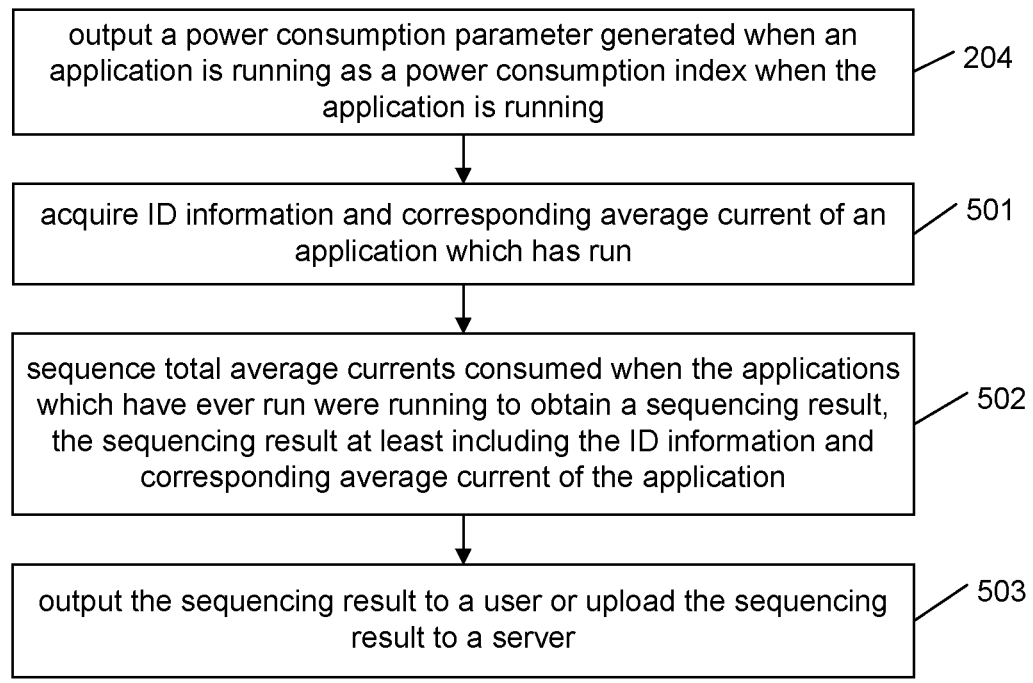
FIG. 5 is a second implementation flowchart of an electricity amount detection method according to embodiment 4 of the disclosure.

Here, subsequent processing may specifically refer to various kinds of processing in embodiment 4, such as processing of sending first alarm information in an embodiment as shown in FIG. 4 and processing of sending a sequencing result in an embodiment as shown in FIG. 5.

The technical solution provided by the third embodiment of the disclosure may be implemented by a computer program, and the computer program, when running, is embodied as the master control thread. Specifically, the terminal, after being started, runs the computer program for initialization, and reads the power consumption parameters in the list stored in the storage unit into a memory, in which the power consumption parameters also exist as a list. The data includes power consumption parameters generated by all applications which have run in recent times, and for each application, the data includes a power consumption parameter of each function device.

In order to obtain latest power consumption data of an application, the terminal is running a master control thread, the master control thread continuously acquires data acquired by each electricity amount acquisition device, and obtains ID information sent when the application is started, and the master control thread searches a memory list for the ID information, replaces oldest data with a newly acquired power usage condition to keep all groups of data latest if the ID information is found, and if the ID information is not found, adds a piece of application information into the list and synchronously stores it into the storage unit when the list is refreshed. Based on the acquired power consumption parameters and application running conditions, an application developer may develop various applications and applications for controlling the former, and of course, may also provide application interfaces embodying the technical solution of the embodiment of the disclosure for a third-party developer, thereby creating a higher utilization value.

Embodiment 4

Based on the abovementioned embodiment, the embodiment of the disclosure provides an electricity amount detection method. Generally speaking, a maximum output current in a terminal is limited, a running application may call multiple function devices, and when a maximum current when the application is running exceeds a preset current threshold, basic information may be provided for a developer or user of the application, and an alarm is provided for the user to instantly stop the application; here, the maximum current when the application is running may be determined by virtue of a maximum current consumed by each function device called by the application, a specific implementation process of which is shown in FIG. 4. The process includes the steps shown by Step 201 to Step 204 in FIG. 2, which will not be elaborated herein. After Step 204, the process further includes the following steps.

In Step 401, a maximum current value when each function device is called is correspondingly acquired according to the ID information of each function device called by the application.

In Step 402, a maximum current value consumed when the application is running is determined according to the maximum current value consumed by each function device.

Here, a sum of the maximum current value consumed by each function device may be determined as the maximum current value consumed when the application is running.

In Step 403, when it is judged that the maximum current value consumed when the application is running is higher than a preset current threshold value, a first alarm message is sent.

Here, the first alarm message is used to prompt that the maximum current value consumed when the application is running is higher than the preset current threshold value and a danger may be brought.

Based on the abovementioned embodiment, when an application is running, electricity amount information of each function device called by the application may be acquired, a power consumption parameter of the application may be determined according to the electricity amount information of each function device, and the power consumption parameter of the application may be displayed to a user in a form of proportion and rank analysis or uploaded to a server for an application developer or an application provider to use. A specific implementation process is shown in FIG. 5, and the process includes the steps shown by Step 201 to Step 204 in FIG. 2, which will not be elaborated herein. After Step 204, the process further includes the following steps.

In Step 501, ID information and corresponding average current of an application which has run are acquired.

In Step 502, a total average current consumed when the application which has run was running is sequenced to obtain a sequencing result, the sequencing result including at least the ID information and corresponding average current of the application.

In Step 503, the sequencing result is output to a user or uploaded to a server.

Figure 6:
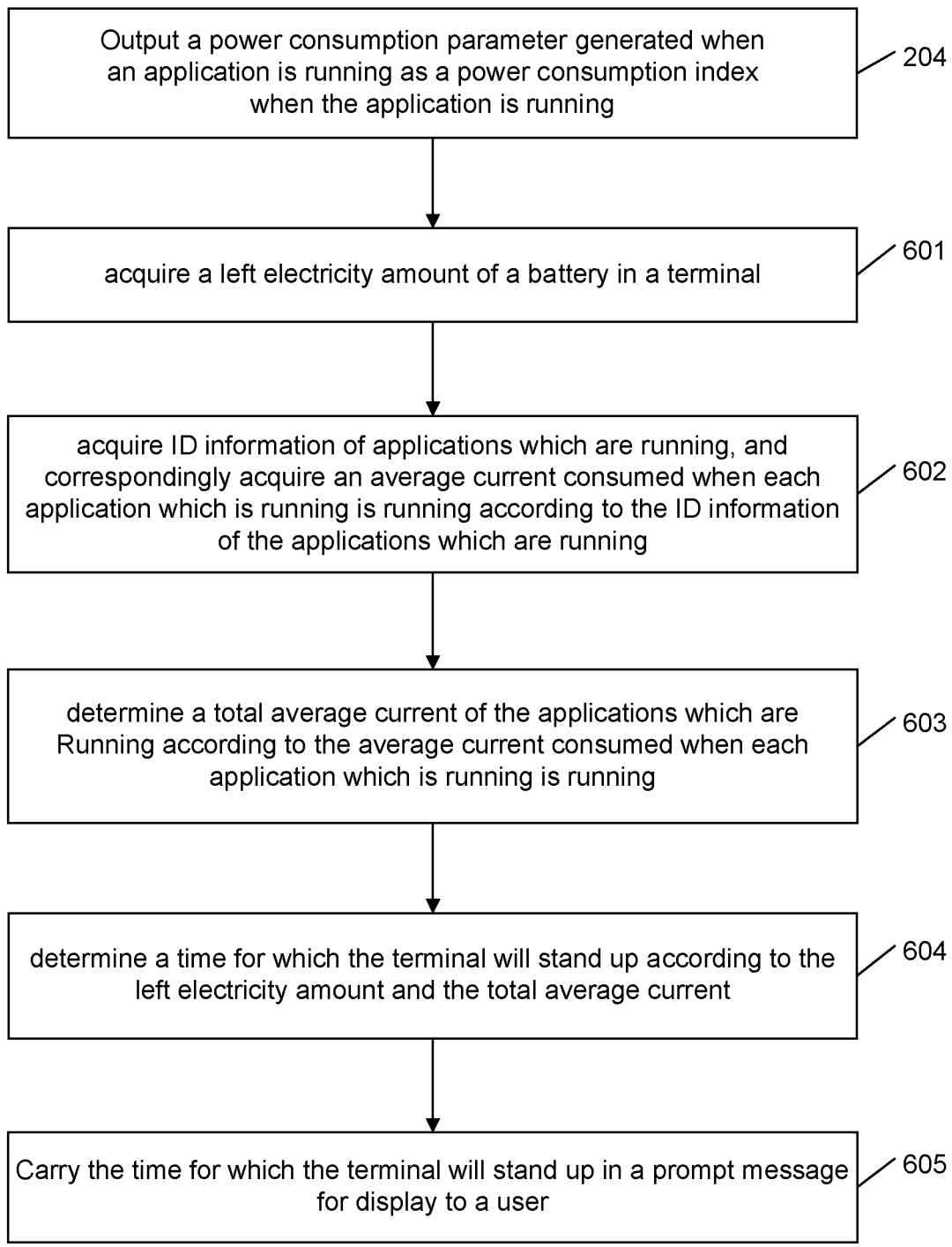
FIG. 6 is a third implementation flowchart of an electricity amount detection method according to embodiment 4 of the disclosure.

Based on the abovementioned embodiment, when the terminal is running an application, electricity amount consumed by each function device called by the application may be statistically acquired, to calculate a left electricity amount of a battery in the terminal. Of course, a time for which the terminal may stand up may also be determined according to a current power usage condition. A specific implementation process is shown in FIG. 6, which includes the steps shown by Step 201 to Step 204 in FIG. 2, which will not be elaborated herein. After Step 204, the process further includes the following steps.

In Step 601, a left electricity amount of a battery in the terminal is acquired.

In Step 602, ID information of each of applications which are running is acquired, and an average current consumed when each application is running is correspondingly acquired according to the ID information of the applications which are running.

In Step 603, a total average current of the applications which are running is determined according to the average current consumed when each application which is running.

In Step 604, a time for which the terminal may stand up is determined according to the left electricity amount and the total average current.

Here, the left electricity amount may be divided by the total average current to obtain a value indicating the time for which the terminal may stand up.

In Step 605, the time for which the terminal may stand for is carried in a prompt message for display to the user.

In the embodiment of the disclosure, Step 601 includes the following steps.

In Step 6011, an electricity amount currently consumed by each of the function devices is acquired, and a consumed electricity amount of the battery in the mobile terminal is determined according to electricity amount currently consumed by each function device.

In Step 6012, a rated electricity amount of the battery in the terminal is acquired.

In Step 6013, the left electricity amount of the battery is determined according to the rated electricity amount and the consumed electricity amount of the battery.

Specifically, a difference between the rated electricity amount and the consumed electricity amount of the battery may be determined as the left electricity amount of the battery.

Figure 7:
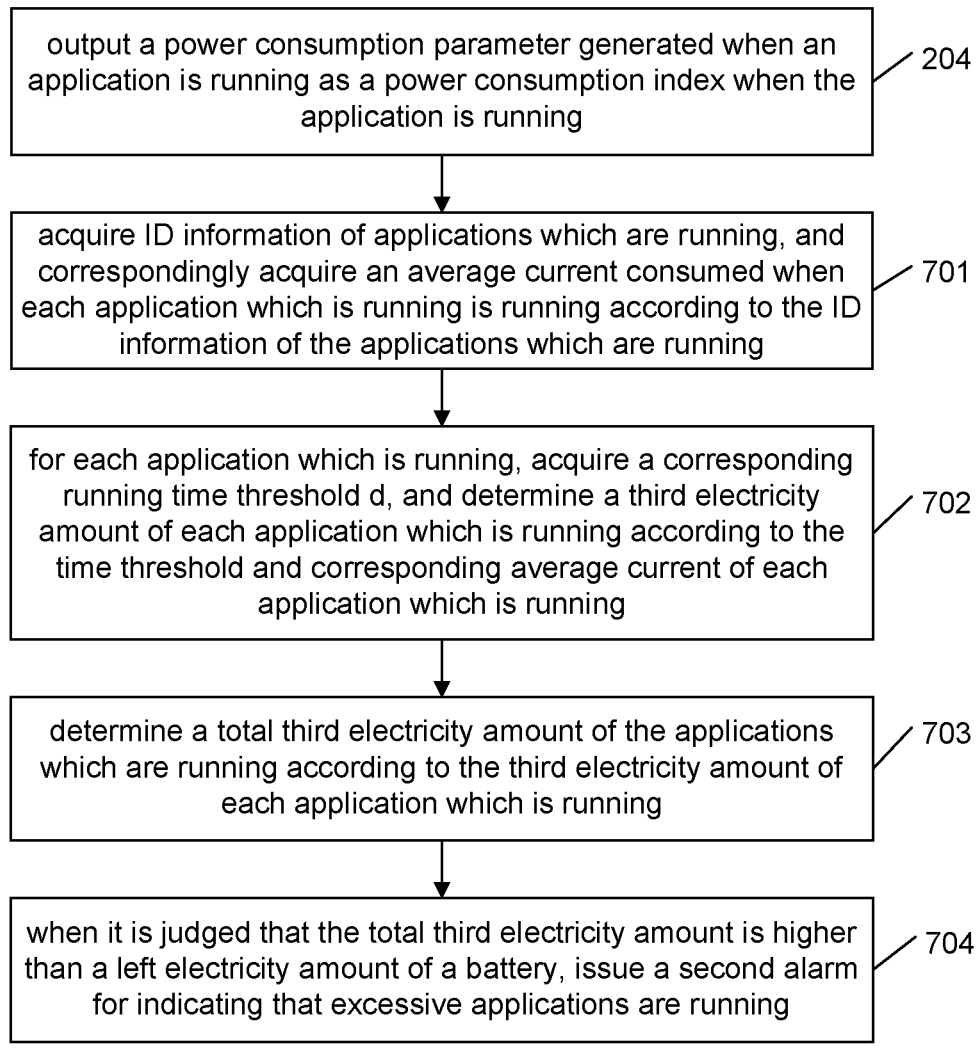
FIG. 7 is a fourth implementation flowchart of an electricity amount detection method according to embodiment 4 of the disclosure.

Based on the abovementioned embodiment, the electricity amount to be consumed when the application is running for a certain period of time may be calculated according to electricity amount information consumed when the application is running, and a time for which the application may run may be determined according to left electricity amount of the terminal. Of course, when the application is running, it is not desired by the user that the application can be running for just a short period of time; therefore, a running time threshold may be set, by the user, or, not by the user. When an application which is running or an application the user is intended to start may not run for a time exceeding the time threshold, the application quits after alarm or does not run. A specific implementation process is shown in FIG. 7, which includes the steps shown by Step 201 to Step 204 in FIG. 2, which will not be elaborated herein. After Step 204, the process further includes the following steps.

In Step 701, ID information of applications which are running is acquired, and an average current consumed when each application which is running is correspondingly acquired according to the ID information of the applications which are running.

In Step 702, for each application which is running, a corresponding running time threshold is acquired, and a third electricity amount of each application which is running is determined according to the time threshold and corresponding average current of each application which is running.

In Step 703: total third electricity amount of the applications which are running is determined according to the third electricity amount of each application which is running.

In Step 704: when it is judged that the total third electricity amount is higher than the left electricity amount of the battery, a second alarm is issued for indicating that excessive applications are running.

Here, taking one application is running in the terminal as an example, referring to FIG. 1, it is supposed that only the application 41 is running in the terminal, electricity amount (C31, C32, . . . C3N) currently consumed by each function device 31 to 3N is acquired at first, and then consumed electricity amount of the battery in the terminal is Cbat=C31+C32+ . . . +C3N. Since the rated electricity amount Cfull of the battery is known, the left electricity amount Cleft of the battery may be determined by the following formula (21):

$$Cleft=Cfull-Cbat \qquad (21).$$

Then, a power consumption parameter of the application 41 in a memory list is acquired. Here, for example, for an average current, three average currents of the application 41 are I41_1, I41_2 and I41_3, and a final referable average current of the application is:

$$I41=(I41\_1+I41\_2+I41\_3)\div 3 \qquad (22).$$

It is supposed that a running time threshold of the application 41 is T, and minimum electricity amount Cthre required by the application 41 within a running time period T may be calculated through the following formula:

$$Cthre=I41\times T \qquad (23).$$

Then, it is judged whether Cleft is smaller than Cthre, and when Cleft<Cthre, a second alarm message may be sent to the user.

Embodiment 5

Figure 8:
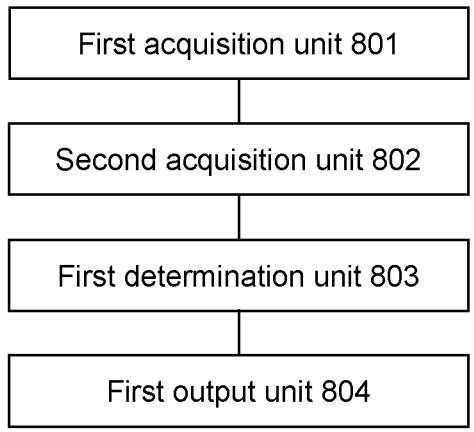
FIG. 8 is a structure diagram of a terminal according to embodiment 5 of the disclosure.

The embodiment of the disclosure provides a terminal. FIG. 8 is a structure diagram of a terminal according to embodiment 5 of the disclosure. As shown in FIG. 8, the terminal includes a first acquisition unit 801, a second acquisition unit 802, a first determination unit 803 and a first output unit 804, wherein the first acquisition unit 801 is arranged to acquire ID information of each function device called by an application according to ID information of the application;

the second acquisition unit 802 is arranged to correspondingly acquire a power consumption parameter generated when each function device is called according to the ID information of each function device called by the application;

the first determination unit 803 is arranged to determine a power consumption parameter generated when the application is running according to the power consumption parameter generated by each function device; and the first output unit 804 is arranged to output the power consumption parameter generated when the application is running as a power consumption index when the application is running.

In the embodiment of the disclosure, when the power consumption parameter is an average current, the first determination unit includes a first acquisition module and a first determination module, wherein the first acquisition module is arranged to acquire a called time period of each function device and an electricity amount corresponding to the called time period according to the ID information of each function device called by the application; and the first determination module is arranged to determine an average current consumed when each function device is called according to the called time period of each function device and the electricity amount corresponding to the called time period.

In the embodiment of the disclosure, the first acquisition module includes a first acquisition sub-module, a first determination sub-module, a second acquisition sub-module and a second determination sub-module, wherein the first acquisition sub-module is arranged to acquire a starting time and corresponding ending time of calling each function device by the application according to the ID information of each function device called by the application; and the first determination sub-module is arranged to determine the called time period of each function device according to the starting time and corresponding ending time of calling each function device by the application.

The second acquisition sub-module is arranged to acquire a first electricity amount consumed by each function device when the application starts calling each function device according to the ID information of each function device called by the application, and correspondingly acquire a second electricity amount consumed by each function device when calling of each function device is ended.

The second determination sub-module is arranged to, for each function device, determine the electricity amount consumed by each function device called by the application according to the second electricity amount and the first electricity amount.

In the embodiment of the disclosure, the terminal further includes a third acquisition unit, a second determination unit and a first sending unit, wherein the third acquisition unit is arranged to correspondingly acquire a maximum current value when each function device is called according to the ID information of each function device called by the application;

the second determination unit is arranged to determine a maximum current value consumed when the application is running according to the maximum current value consumed by each function device; and the first sending unit is arranged to, when the maximum current value consumed when the application is running is higher than a preset current threshold value, send a first alarm message for prompting that a danger will be brought due to that the maximum current value consumed when the application is running is higher than the preset current threshold value.

In the embodiment of the disclosure, the terminal further includes a forming unit, arranged to form a list at least including the ID information of the application and the power consumption parameter corresponding to the application; here, the power consumption parameter at least includes the average current; and correspondingly, the second acquisition unit is arranged to query the list to obtain the power consumption parameter generated when each function device is called according to the ID information of each function device called by the application.

In the embodiment of the disclosure, when the power consumption parameter is the average current, the forming unit includes a second acquisition module, a third acquisition module, a fourth acquisition module and a forming module, wherein the second acquisition module is arranged to, every time when the terminal is started, acquire ID information of applications which are running;

the third acquisition module is arranged to correspondingly acquire ID information of each function device called by each application which is running according to the ID information of the applications which are running;

the fourth acquisition module is arranged to, for each application which is running, acquire a power consumption parameter of each function device called by each application which is running; and the forming module is arranged to form a list according to the power consumption parameter when each function device is called, the ID information of the corresponding application and the ID information of the function device.

In the embodiment of the disclosure, the forming module includes a judgment sub-module, an addition sub-module and an updating module, wherein the second acquisition module is arranged to, every time when the terminal is started, acquire ID information of applications which are running;

the third acquisition module is arranged to correspondingly acquire ID information of each function device called by each application which is running according to the ID information of the applications which are running;

the fourth acquisition module is arranged to, for each application which is running, acquire a power consumption parameter of each function device called by each application which is running; and the forming module is arranged to form a list according to the power consumption parameter when each function device is called, the ID information of the corresponding application and the ID information of the function device.

In the embodiment of the disclosure, the terminal further includes a fourth acquisition unit, a sequencing unit and a processing unit.

The fourth acquisition unit is arranged to acquire ID information and corresponding average currents of applications that have ever run.

The sequencing unit is arranged to sequence total average currents consumed when the applications that have ever run were running to obtain a sequencing result, the sequencing result at least comprising the ID information and corresponding average currents of the applications.

The processing unit is arranged to output the sequencing result to a user or upload the sequencing result to a server.

In the embodiment of the disclosure, the terminal further includes a fifth acquisition unit, a sixth acquisition unit, a third determination unit, a fourth determination unit and a display unit.

The fifth acquisition unit is arranged to acquire a left electricity amount of a battery in the terminal.

The sixth acquisition unit is arranged to acquire ID information of applications which are running, and correspondingly acquire an average current consumed when each application which is running is running according to the ID information of the applications which are running.

The third determination unit is arranged to determine a total average current of the applications which are running according to the average current consumed when each application which is running is running.

The fourth determination unit is arranged to determine a time for which the terminal will stand up according to the left electricity amount and the total average current; and the display unit is arranged to carry the time for which the terminal will stand up in a prompt message for display to the user.

In the embodiment of the disclosure, the fifth acquisition unit includes a fifth acquisition module, a sixth acquisition module and a third determination module.

The fifth acquisition module is arranged to acquire an electricity amount currently consumed by each function device in all the function devices, and determine a consumed electricity amount of the battery in the mobile terminal according to the electricity amount currently consumed by each function device.

The sixth acquisition module is arranged to acquire a rated electricity amount of the battery in the terminal.

The third determination module is arranged to determine the left electricity amount of the battery according to the rated electricity amount and the consumed electricity amount of the battery.

In the embodiment of the disclosure, the terminal further includes a seventh acquisition unit, a fifth determination unit, a sixth determination unit and a second sending unit.

The seventh acquisition unit is arranged to acquire ID information of applications which are running, and correspondingly acquire an average current consumed when each application which is running is running according to the ID information of the applications which are running.

The fifth determination unit is arranged to, for each application which is running, acquire a corresponding running time threshold, and determine a third electricity amount of each application which is running according to the time threshold and corresponding average current of each application which is running.

The sixth determination unit is arranged to determine total third electricity amount of the applications which are running according to the third electricity amount of each application which is running.

The second sending unit is arranged to, when it is judged that the total third electricity amount is higher than the left electricity amount of the battery, send a second alarm for indicating that excessive applications are running.

It is to be noted that: descriptions about the terminal in the embodiment of the disclosure are similar to the descriptions about the electricity amount detection method, are the same as the descriptions about beneficial effects of the electricity amount detection method, and will not be elaborated. Technical details undisclosed in the embodiment of the terminal of the disclosure refer to the descriptions in the embodiment of the method of the disclosure.

The units such as the first acquisition unit, second acquisition unit, first determination unit, first output unit, third acquisition unit, second determination unit, first sending unit and forming unit as well as modules respectively included by each unit in the terminal provided by the embodiment of the disclosure may all be implemented by a processor in the mobile terminal, and of course, may also be implemented by specific logic circuits. In processes of the specific embodiments, the processor may be a Central Processing Unit (CPU), Micro Processing Unit (MPU), Digital Signal Processor (DSP), Field-Programmable Gate Array (FPGA) or the like.

It is to be noted that: in the embodiments of the disclosure, if being implemented in form of software function module and sold or used as an independent product, the electricity amount detection method may also be stored in a computer-readable storage medium. Based on such an understanding, the technical solutions of the embodiments of the disclosure substantially or parts contributing to a conventional art may be embodied in form of software product, and the computer software product is stored in a storage medium, including a plurality of instructions arranged to enable a computer device (which may be a personal computer, a server, a network device or the like) to execute all or part of the method in each embodiment of the disclosure. The storage medium includes: various media capable of storing program codes such as a U disk, a mobile hard disk, a Read Only Memory (ROM), a magnetic disk or an optical disk. Therefore, the embodiments of the disclosure are not limited to any specific hardware and software combination.

Correspondingly, the embodiments of the disclosure further provide a computer storage medium, in which a computer-executable instruction is stored, the computer-executable instruction being arranged to execute an electricity amount detection method provided by each embodiment of the disclosure.

In some embodiments provided by the disclosure, it should be understood that the disclosed device and method may be implemented in another manner. The device embodiment described above is only schematic, and for example, division of the units is only logic function division, and other division manners may be adopted during practical implementation. For example, multiple units or components may be combined or integrated into another system, or some characteristics may be neglected or not executed. In addition, communication connection between each displayed or discussed component may be indirect coupling or communication connection, implemented through some interfaces, of the device or the units, and may be electrical and mechanical or adopt other forms.

The abovementioned units described as separate parts may or may not be physically separated, and parts displayed as units may or may not be physical units, and namely may be located in the same place, or may also be distributed to multiple network units. Part or all of the units may be selected to achieve the purpose of the solutions of the disclosure according to a practical requirement.

In addition, each function unit in each embodiment of the disclosure may be integrated into a processing unit, each unit may also exist independently, and two or more than two unit may also be integrated into a unit. The abovementioned integrated unit may be implemented in a hardware form, and may also be implemented in form of hardware and software function unit.

Those skilled in the art should know that: all or part of the steps of the abovementioned method embodiment may be implemented by instructing related hardware through a program, the abovementioned program may be stored in a computer-readable storage medium, and the program is executed to execute the steps of the abovementioned method embodiment; and the storage medium includes: various media capable of storing program codes such as a mobile storage device, a ROM, a magnetic disk or an optical disk.

Or, when being implemented in form of software function device and sold or used as an independent product, the integrated unit of the disclosure may also be stored in a computer-readable storage medium. Based on such an understanding, the technical solutions of the embodiments of the disclosure substantially or parts making contributions to the conventional art may be embodied in form of software product, and the computer software product is stored in a storage medium, including a plurality of instructions arranged to enable a computer device (which may be a personal computer, a server, a network device or the like) to execute all or part of the method in each embodiment of the disclosure. The abovementioned storage medium includes: various media capable of storing program codes such as a mobile storage device, a ROM, a magnetic disk or an optical disk.

The above is only the specific implementation mode of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

INDUSTRIAL APPLICABILITY

In the embodiments of the disclosure, the method includes that: the ID information of each function device called by the application is acquired according to the ID information of the application; the power consumption parameter generated when each function device is called is correspondingly acquired according to the ID information of each function device called by the application; the power consumption parameter generated when the application is running is determined according to the power consumption parameter generated by each function device; and the power consumption parameter generated when the application is running is output as the power consumption index when the application is running. Therefore, a power usage condition of each function device when the application is running may be accurately determined.

What is claimed is:

1. An electricity amount detection method applied to a terminal, comprising:
    acquiring, according to identity (ID) information of an application in the terminal, ID information of each function device called by the application; wherein, the application calls one or more than one function devices at the same time;
    acquiring through an electricity amount acquisition device in the terminal, according to the ID information of each function device called by the application, a power consumption parameter generated when each function device is called; wherein the power consumption parameter comprises: a lowest current, a highest current or an average current;
    calculating a total power consumption parameter according to all acquired power consumption parameters generated by the called function devices;
    determining the calculated total power consumption parameter as a power consumption parameter generated when the application is running; and
    outputting the power consumption parameter generated when the application is running as a power consumption index when the application is running.

2. The method according to claim 1, wherein, when the power consumption parameter is an average current, acquiring through an electricity amount acquisition device in the terminal, according to the ID information of each function device called by the application, a power consumption parameter generated when each function device is called comprises:
    acquiring, according to the ID information of each function device called by the application, a called time period of each function device and an electricity amount corresponding to the called time period; and
    determining, according to the called time period of each function device and the electricity amount corresponding to the called time period, an average current consumed when each function device is called.

3. The method according to claim 2, wherein acquiring, according to the ID information of each function device called by the application, a called time period of each function device comprises:
    acquiring, according to the ID information of each function device called by the application, a starting time and a corresponding ending time of calling each function device by the application;
    determining, according to the starting time and the corresponding ending time of calling each function device by the application, the called time period of each function device;
    correspondingly, acquiring the electricity amount corresponding to the time period comprises:
    according to the ID information of each function device called by the application, acquiring a first electricity amount which has been consumed by each function device when the application starts calling each function device, and correspondingly acquiring a second electricity amount which has consumed by each function device when the calling of each function device is ended; and
    for each function device, determining a difference between the second electricity amount and the first electricity amount as the electricity amount consumed by each function device called by the application.

4. The method according to claim 1, further comprising:
    correspondingly acquiring, according to the ID information of each function device called by the application, a maximum current value when each function device is called;
    determining, according to the maximum current value consumed by each function device, a maximum current value consumed when the application is running; and
    when it is judged that the maximum current value consumed when the application is running is higher than a preset current threshold value, issuing a first alarm message for prompting that a danger will be brought due to that the maximum current value consumed when the application is running is higher than the preset current threshold value.

5. The method according to claim 1, further comprising: forming a list at least comprising the ID information of each application and the power consumption parameter corresponding to the application, wherein the power consumption parameter at least comprises the average current; and
    wherein correspondingly acquiring, according to the ID information of each function device called by the application, the power consumption parameter generated when each function device is called comprises:
    querying, according to the ID information of each function device called by the application, the list to obtain the power consumption parameter generated when each function device is called.

6. The method according to claim 5, wherein, when the power consumption parameter is the average current, forming the list at least comprising the ID information of each application and the power consumption parameter corresponding to the application comprises:
    every time when a terminal is started, acquiring ID information of each application which is running;
    correspondingly acquiring, according to the ID information of each application which is running, ID information of each function device called by each application which is running; and
    for each application which is running, acquiring, through the electricity amount acquisition device in the terminal, a power consumption parameter of each function device called by the application which is running, and forming a list according to the power consumption parameter generated when each function device is called, the ID information of the corresponding application and the ID information of the function device.

7. The method according to claim 6, wherein forming the list according to the power consumption parameter generated when each function device is called, the ID information of the corresponding application and the ID information of the function device comprises:
    judging whether ID information of each application which is running is comprised in the list or not; updating the power consumption parameters of the applications in the list, when the ID information of each application which is running is comprised in the list; and adding ID information of a new application, ID information of function devices called by the new application and a power consumption parameter corresponding to each function device into the list, when the ID information of the new application which is running is not comprised in the list.

8. The method according to claim 1, further comprising:
acquiring ID information and corresponding average currents of applications that have ever run;
sequencing total average currents consumed when the applications that have ever run were running to obtain a sequencing result, the sequencing result at least comprising the ID information and corresponding average currents of the applications; and
outputting the sequencing result to a user or uploading the sequencing result to a server.

9. The method according to claim 1, further comprising:
acquiring a left electricity amount of a battery in the terminal;
acquiring ID information of applications which are running;
correspondingly acquiring, according to the ID information of applications which are running, respective average currents consumed when the applications which are running are running;
determining, according to the average currents consumed when the applications which are running are running, a total average current of the applications which are running;
determining a time for which the terminal will stand up according to the left electricity amount and the total average current; and
carrying the time for which the terminal will stand up in a prompt message for display to the user.

10. The method according to claim 9, wherein acquiring the left electricity amount of the battery in the terminal comprises:
acquiring an electricity amount currently consumed by each of all the function devices, and determining a consumed electricity amount of the battery in the mobile terminal according to the electricity amount currently consumed by each of all the function devices;
acquiring a rated electricity amount of the battery in the terminal; and
determining the left electricity amount of the battery according to the rated electricity amount and the consumed electricity amount of the battery.

11. The method according to claim 9, further comprising:
acquiring ID information of applications which are running, and correspondingly acquiring, according to the ID information of the applications which are running, an average current consumed when each application which is running is running;
for each application which is running, acquiring a corresponding running time threshold, and determining a third electricity amount of each application which is running according to the time threshold and corresponding average current of each application which is running;
determining a total third electricity amount of the applications which are running according to the third electricity amount of each application which is running; and
when it is judged that the total third electricity amount is higher than the left electricity amount of the battery, issuing a second alarm for indicating that excessive applications are running.

12. A terminal, comprising
a processor; and
a memory for storing instructions executable by the processor, wherein the processor is arranged to:
acquire Identity (ID) information of each function device called by an application in the terminal according to ID information of the application; wherein, the application calls one or more than one function devices at the same time;
acquire a power consumption parameter generated when each function device is called through an electricity amount acquisition device in the terminal, according to the ID information of each function device called by the application; wherein the power consumption parameter comprises: a lowest current, a highest current or an average current;
calculate a total power consumption parameter according to all acquired power consumption parameters generated by the called function devices;
determine the calculated total power consumption parameter as a power consumption parameter generated when the application is running; and
output the power consumption parameter generated when the application is running as a power consumption index when the application is running.

13. The terminal according to claim 12, wherein the processor is further arranged to:
acquire a maximum current value when each function device is called according to the ID information of each function device called by the application;
determine a maximum current value consumed when the application is running according to the maximum current value consumed by each function device; and
when the maximum current value consumed when the application is running is higher than a preset current threshold value, send a first alarm message for prompting that a danger will be brought due to that the maximum current value consumed when the application is running is higher than the preset current threshold value.

14. The terminal according to claim 12, wherein the processor is further arranged to:
form a list at least comprising the ID information of the application and the power consumption parameter corresponding to the application, wherein the power consumption parameter at least comprises an average current; and
query the list to obtain the power consumption parameter generated when each function device is called according to the ID information of each function device called by the application.

15. The terminal according to claim 14, wherein, when the power consumption parameter is the average current, the processor is further arranged to:
every time when the terminal is started, acquire ID information of applications which are running;
correspondingly acquire ID information of each function device called by each application which is running according to the ID information of the applications which are running;
for each application which is running, acquire, through the electricity amount acquisition device in the terminal, a power consumption parameter of each function device called by each application which is running; and
form the list according to the power consumption parameter when each function device is called, the ID information of the corresponding application and the ID information of the function device.

16. The terminal according to claim 15, wherein the processor is further arranged to:
judge whether ID information of each application which is running is comprised in the list or not; update the power consumption parameters of the applications in the list, when the ID information of each application which is running is comprised in the list; and add the ID information of the new application, ID information of function devices called by the new application and a power consumption parameter corresponding to each function device into the list, when the ID information of a new application which is running is not comprised in the list.

17. The terminal according to claim 12, wherein the processor is further arranged to:
   acquire ID information and corresponding average currents of applications that have ever run;
   sequence total average currents consumed when the applications that have ever run were running to obtain a sequencing result, the sequencing result at least comprising the ID information and corresponding average currents of the applications; and
   output the sequencing result to a user or upload the sequencing result to a server.

18. The terminal according to claim 12, wherein the terminal further comprises an electricity amount detection device, wherein the electricity amount detection device comprises a power supply device, a Power Management Integrated Circuit (PMIC), N power supplies, N function devices, N electricity amount acquisition devices, a baseband processing chip and a memory, wherein N is an integer more than 1; wherein:
   the electricity amount detection device is shunted by the PMIC to form the N power supplies with completely different voltages;
   the N function devices are connected with the N power supplies through N lines in an one-to-one correspondence according to respective required voltages;
   on each line between the N function devices and the N power supplies, a respective one of the electricity amount acquisition devices is distributed; and
   each electricity amount acquisition device sends an acquired electricity amount to the baseband processing chip, which stores the electricity amount consumed by each function device in the memory.

19. A non-transitory computer storage medium, in which computer-executable instructions are stored, the computer-executable instructions are arranged to execute an electricity amount detection method applied to a terminal, comprising:
   acquiring, according to identity (ID) information of an application in the terminal, ID information of each function device called by the application; wherein, the application calls one or more than one function devices at the same time;
   acquiring through an electricity amount acquisition device in the terminal, according to the ID information of each function device called by the application, a power consumption parameter generated when each function device is called; wherein the power consumption parameter comprises: a lowest current, a highest current or an average current;
   calculating a total power consumption parameter according to all acquired power consumption parameters generated by the called function devices;
   determining the calculated total power consumption parameter as a power consumption parameter generated when the application is running; and
   outputting the power consumption parameter generated when the application is running as a power consumption index when the application is running.

20. The non-transitory computer storage medium according to claim 19, wherein, when the power consumption parameter is an average current, acquiring through an electricity amount acquisition device in the terminal, according to the ID information of each function device called by the application, a power consumption parameter generated when each function device is called comprises:
   acquiring, according to the ID information of each function device called by the application, a called time period of each function device and an electricity amount corresponding to the called time period; and
   determining, according to the called time period of each function device and the electricity amount corresponding to the called time period, an average current consumed when each function device is called.

* * * * *